US006996504B2

(12) United States Patent
Novotny et al.

(10) Patent No.: US 6,996,504 B2
(45) Date of Patent: Feb. 7, 2006

(54) FULLY SCALABLE COMPUTER ARCHITECTURE

(75) Inventors: Mark A. Novotny, Starkville, MS (US); Gyorgy Korniss, Latham, NY (US)

(73) Assignee: Mississippi State University, Mississippi State, MS (US)

( * ) Notice: Subject to any disclaimer, the term of this patent is extended or adjusted under 35 U.S.C. 154(b) by 742 days.

(21) Appl. No.: 09/990,681

(22) Filed: Nov. 14, 2001

(65) Prior Publication Data

US 2002/0087299 A1 Jul. 4, 2002

Related U.S. Application Data

(60) Provisional application No. 60/248,911, filed on Nov. 14, 2000.

(51) Int. Cl.
*G06F 17/50* (2006.01)
(52) U.S. Cl. ................. 703/1; 712/11; 712/15; 712/16
(58) Field of Classification Search .............. 703/1; 712/11, 15, 16; 370/351; 710/100
See application file for complete search history.

(56) References Cited

U.S. PATENT DOCUMENTS

| | | | |
|---|---|---|---|
| 4,805,091 A | | 2/1989 | Thiel et al. |
| 5,598,408 A | * | 1/1997 | Nickolls et al. ............ 370/351 |
| 5,603,044 A | | 2/1997 | Annapareddy et al. |
| 5,675,743 A | * | 10/1997 | Mavity ....................... 710/100 |
| 5,689,677 A | * | 11/1997 | MacMillan ................. 711/106 |
| 5,737,628 A | | 4/1998 | Birrittella et al. |
| 5,794,005 A | | 8/1998 | Steinman |
| 5,801,938 A | | 9/1998 | Kalantery |
| 5,832,272 A | | 11/1998 | Kalantery |
| 5,859,983 A | | 1/1999 | Heller et al. |
| 5,903,771 A | | 5/1999 | Sgro et al. |
| 5,920,714 A | | 7/1999 | Schiffleger |
| 6,134,514 A | | 10/2000 | Liu et al. |
| 6,138,166 A | | 10/2000 | Heller et al. |
| 6,138,167 A | | 10/2000 | Heller et al. |
| 6,167,502 A | * | 12/2000 | Pechanek et al. ............ 712/15 |
| 6,230,252 B1 | | 5/2001 | Passint et al. |

OTHER PUBLICATIONS

Yi-Bing Lin, Paul A Fishwick; *Asynchronous Parallel Discrete Event Simulation*; IEEE Transactions on Systems, Man and Cybernetics; 1995; pp. 1-33; vol. XX, No. Y.

G. Korniss, Z. Toroszkai, M.A. Novotny, P.A. Rikvold; *From Massively Parallel Algorithms and Fluctuating Time Horizons to Non-equilibrium Surface Growth*; Feb. 2000; pp. 1-4; arXiv:cond-mat/9909114v2 Feb. 1, 2000.

G. Korniss, M.A. Novotny, Z. Toroczkai, P.A. Rikvold; *Non-equilibrium Surface Growth and Scalability of Parallel Algorithms for Large Asynchronous Systems*; Feb. 29, 2000; pp. 1-5.

* cited by examiner

*Primary Examiner*—Albert W. Paladini
(74) *Attorney, Agent, or Firm*—Sutherland Asbill & Brennan LLP

(57) ABSTRACT

A scalable computer architecture capable of performing fully scalable simulations includes a plurality of processing elements (PEs) and a plurality of interconnections between the PEs. In this regard, the interconnections can interconnect each processing element to each neighboring processing element located adjacent the respective processing element, and further interconnect at least one processing element to at least one other processing element located remote from the respective at least one processing element. For example, the interconnections can interconnect the plurality of processing elements according to a fractal-type method or a quenched random method. Further, the plurality of interconnections can include at least one interconnection at each length scale of the plurality of processing elements.

22 Claims, 9 Drawing Sheets

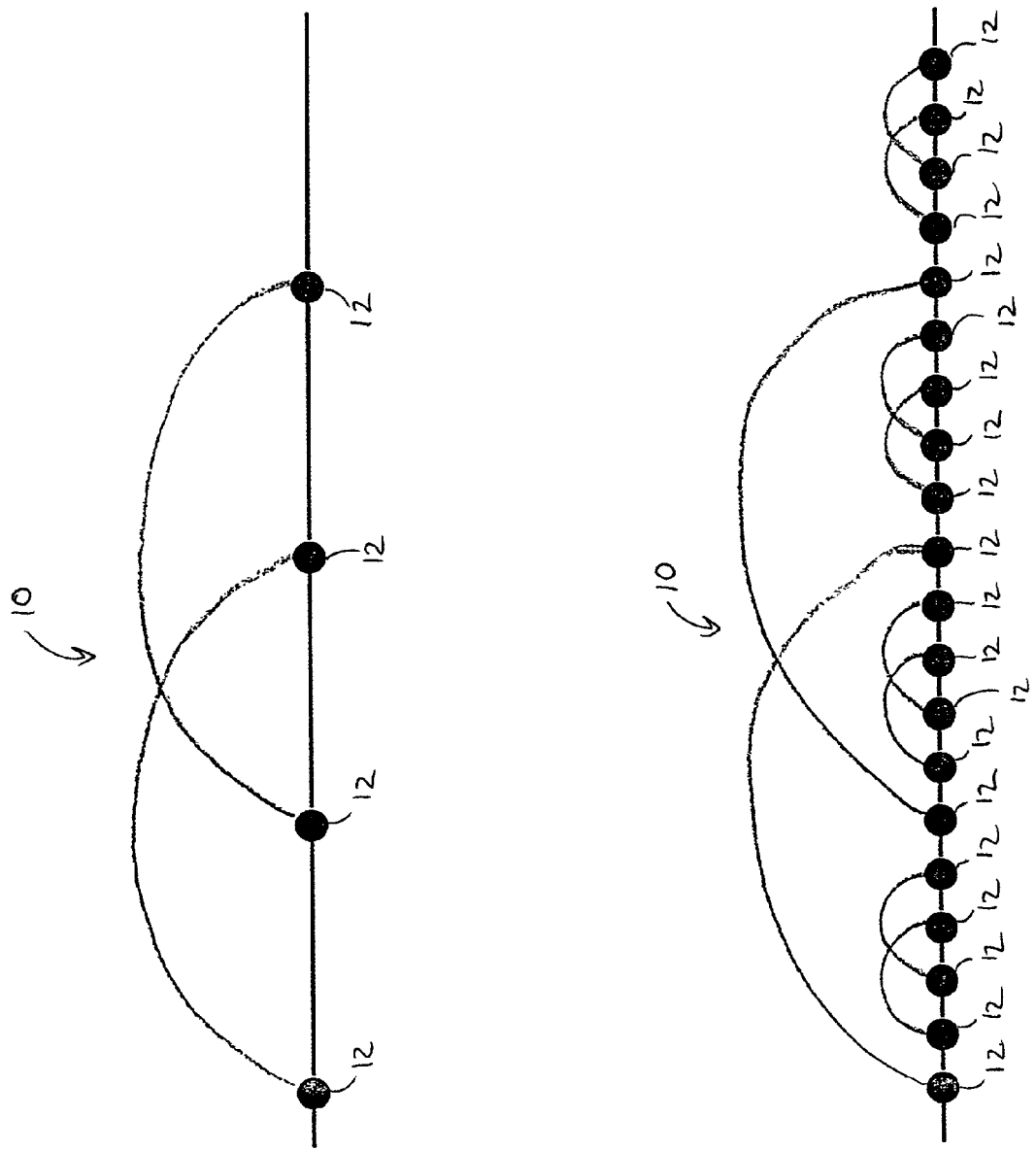

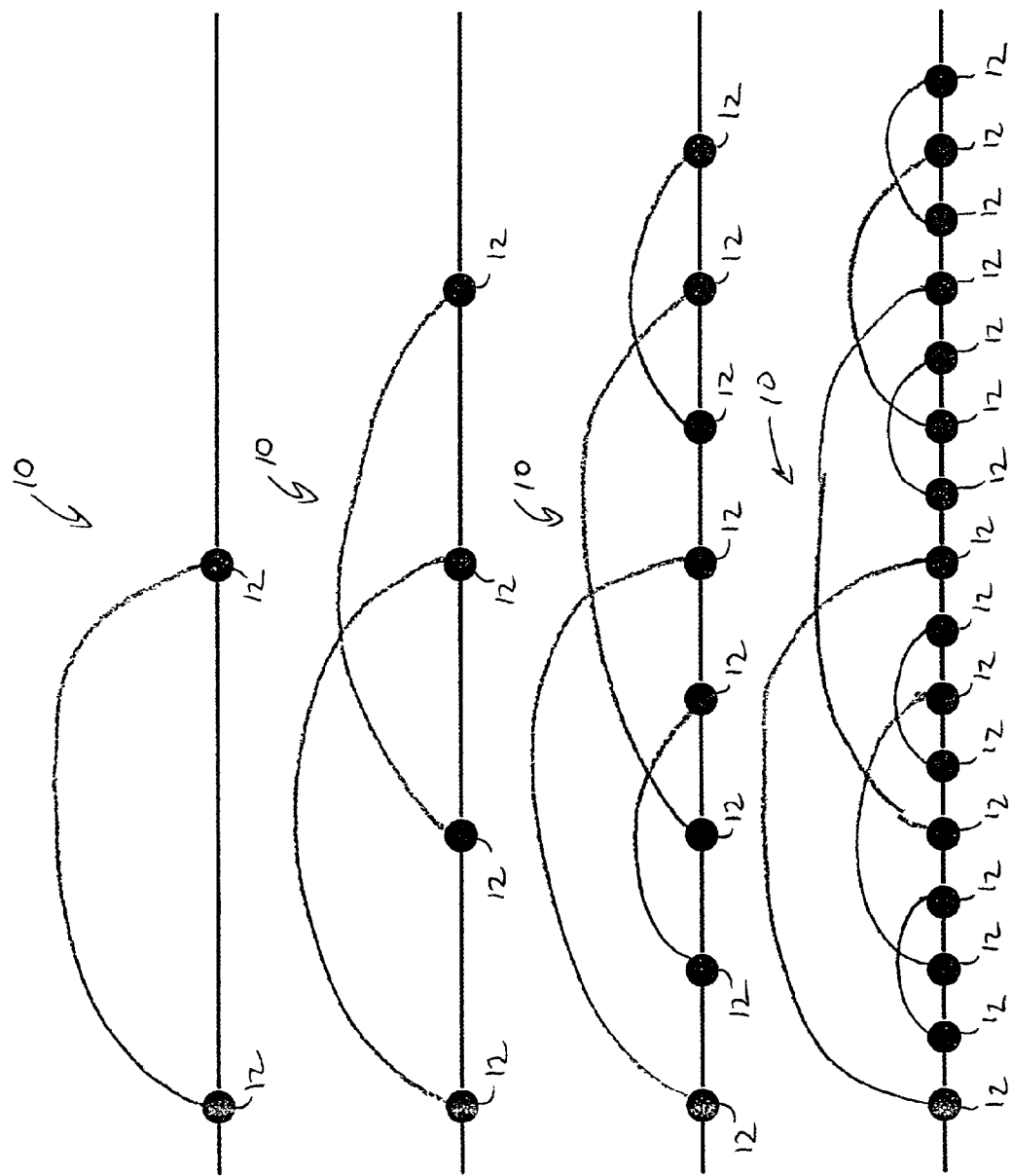

FULLY SCALABLE COMPUTER ARCHITECTURE

CROSS-REFERENCE TO RELATED APPLICATIONS

The present application claims priority from U.S. Provisional Patent Application Ser. No. 60/248,911, entitled: Fully Scalable Computer Architecture for Parallel Discrete Event Simulations filed on Nov. 14, 2000, the contents of which are incorporated herein by reference.

FEDERALLY SPONSORED RESEARCH OR DEVELOPMENT

This invention was made with government support under Contract No. DMR-9871455 awarded by the National Science Foundation. The government may have certain rights in this invention.

FIELD OF THE INVENTION

The present invention relates to multi-processor computer architectures and, more particularly, to multi-processor computer architectures for performing system simulations.

BACKGROUND OF THE INVENTION

Modeling and analysis of the time behavior of dynamic systems is of wide interest in various fields of science and engineering. Because of the complexity of many current dynamic systems, "realistic models" of such dynamic systems often prohibit exact numerical or analytical evaluation of the system. For example, in an extremely wide variety of applications in military, civilian, and scientific computations such as for "war scenarios," video games and queueing theory with applications to banking, cellular networks, wireless networks, manufacturing design, aircraft design and scientific computing, the dynamic systems running the applications are too complex to perform numerical or analytical evaluations on the systems. As a result, simulation of such systems generally remains the accepted tractable method by which to evaluate the systems. One type of simulation that has emerged is Discrete Event Simulation (DES), which discretizes the updates of the simulated system at event occurrence instances.

While the simulation of such complex systems generally remains the accepted tractable method by which to evaluate the systems, conducting simulations is often a time consuming experience. In this regard, once a simulation model has been specified for the system, the simulation run can require an unnecessarily long time to execute due to either the objective of the simulation or the nature of the simulation model. To reduce the time necessary to execute a simulation, importance sampling methods can be implemented in the model. As such, faster simulations can be obtained by using more computational resources, particularly, modem supercomputers that utilize multiple processing elements (PEs) operating in parallel.

To efficiently utilize modem supercomputers requires massively parallel implementations of dynamic algorithms for various physical, chemical, and biological processes. For many of these there are well-known and routinely used schemes, such as serial Monte Carlo (MC) schemes. Dynamic MC simulations are invaluable tools for investigating the evolution of complex systems. For a wide range of systems it is plausible to assume (and in rare cases it is possible to derive) that attempts to update the state of the system form a Poisson process. The basic notion is that time is continuous, and the discrete events (update attempts) occur instantaneously. The state of the system remains constant between events. It is worthwhile to note that the standard random-sequential update schemes (easily implementable on serial computers) produce this dynamic for "free": the waiting-time distribution for the attempts to update each subsystem or component is geometrical and approaches the exponential distribution in the large-system limit. This uniquely characterizes the Poisson process.

The parallel implementation of such dynamic MC algorithms belongs to the class of parallel discrete event simulation (PDES), which is one of the most challenging areas in parallel computing and has numerous applications not only in the physical sciences, but also in computer science, queueing theory, and economics. For example, in lattice Ising models the discrete events are spin-flip attempts, while in queueing systems they are job arrivals. Typically, when a PDES is executed, the PDES repeatedly processes the occurrence of events in simulated time, or "virtual time," by maintaining a time ordered event list holding time-stamped events scheduled to occur in the future, a clock indicating the current time and state variables defining the current state of the system.

Since current special- or multi-purpose parallel computers can have $10^4$–$10^5$ PEs, it would be desirable to design a parallel computer providing for scalability of these algorithms, in both the computation phase and measurement phase of PDES. In this regard, the PDES algorithm is considered scalable if the physical time required to execute the algorithm does not change as the system to be simulated and the number of PEs available both become N times larger. Additionally, as computers become more complex and the PEs become numerous, it would be desirable to design a system that is not only fully scalable with respect to PDES, but is also scalable with respect to the number of connections between PEs while requiring as few connections between PEs as possible.

SUMMARY OF THE INVENTION

In light of the foregoing background, the present invention provides systems and methods that facilitate fully scalable simulations, such as PDES. The systems and methods facilitate the fully scalable simulations while keeping the number of connections between processing elements small and independent of the number of processing elements in the system (thus making the system scalable as to the connections between processing elements).

According to one embodiment, a scalable computer architecture capable of performing fully scalable simulations includes a plurality of processing elements (PEs) and a plurality of interconnections between the PEs capable of interconnecting the PEs. The PEs can be interconnected in a one-dimensional topology, or the PEs can be interconnected in a multi-dimensional topology with a dimension greater than one. In this regard, the interconnections can interconnect each processing element to each neighboring processing element located adjacent the respective processing element. Further, at least one interconnection can interconnect at least one processing element to at least one other processing element located remote from the respective at least one processing element.

To make the connectivity of the architecture scalable, the number of interconnections between processing elements is independent of the number of processing elements. Additionally, to facilitate the scalability of the simulations, at least two interconnections connect each processing element to at least two other processing elements, with at least one additional interconnection interconnecting at least one processing element to at least one other processing element located remote from the respective at least one processing element. For example, the interconnections can interconnect the plurality of processing elements according to a fractal-type method, or according to a quenched random method. Further, to facilitate scalability of the measurement phase of the simulation, the plurality of interconnections can include at least one interconnection at each length scale of the plurality of processing elements.

The present invention also provides a method of fabricating a scalable computer architecture capable of performing fully scalable simulations. According to one embodiment, the method begins by organizing the PEs, such as in a one-dimensional or higher-dimensional topology. Then, the PEs are interconnected, such as according to the fractal-type method or the quenched random method, such that the number of other PEs interconnected to each PE is independent of the number of PEs. In this regard, each PE is interconnected to at least two other PEs, with at least one PE further interconnected to at least one additional PE located remote from the respective at least one PE. Further, the PEs can be interconnected such that at least one pair of processing elements are interconnected at a plurality of length scales of the plurality of processing elements.

Therefore, the present invention provides a scalable computer architecture. The architecture of the present invention includes a small number of interconnections between PEs that are independent of the number of PEs. In this regard, the present invention provides a scalable computer architecture and method of interconnecting PEs in a multi-processor computer that makes both the computational and measurement phases of simulations scalable, while also making the connectivity of PEs scalable. Additionally, the architecture of the present invention requires only a few connections to each PE, thus making the architecture less complex than other architectures requiring each PE interconnected to every other PE.

BRIEF DESCRIPTION OF THE DRAWINGS

Figure 1A:
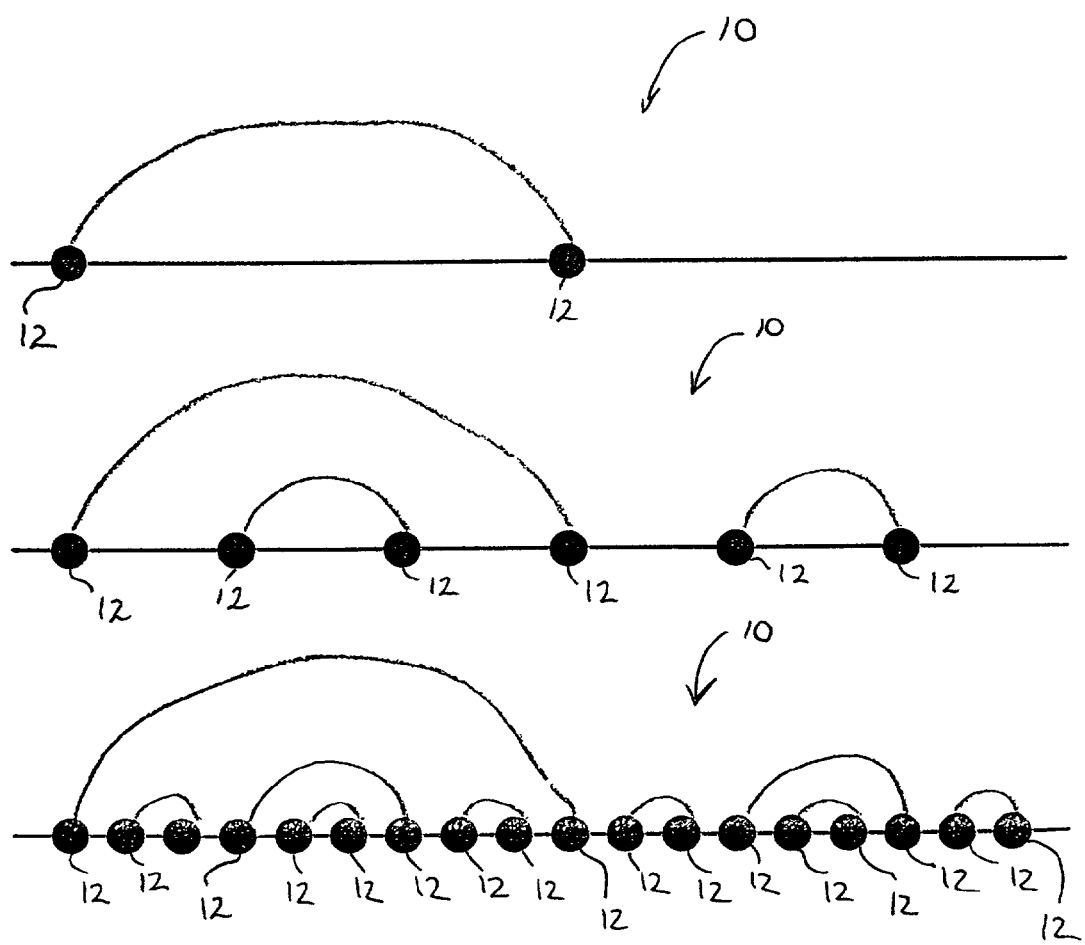
Figure 2:
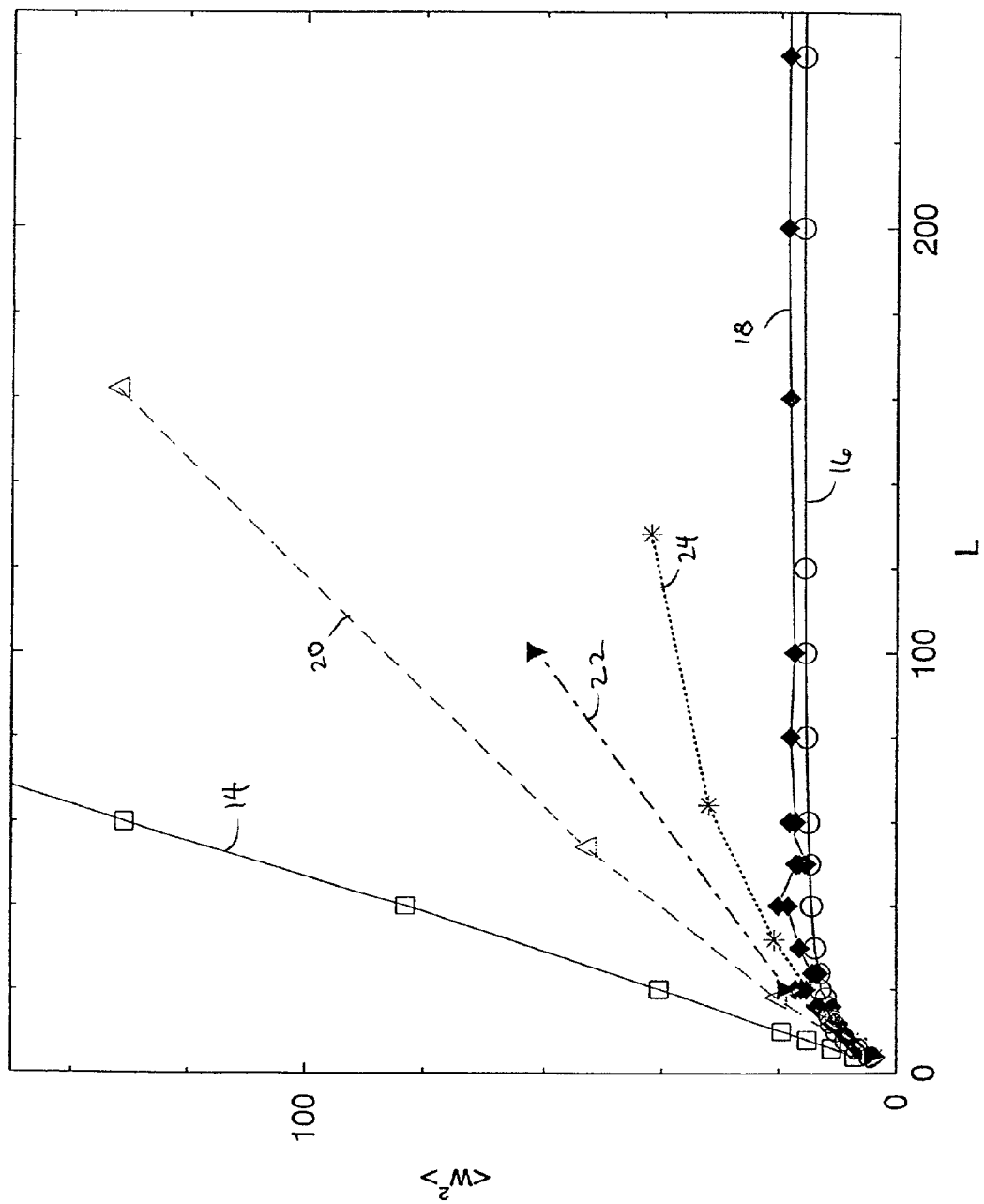
Figure 3:
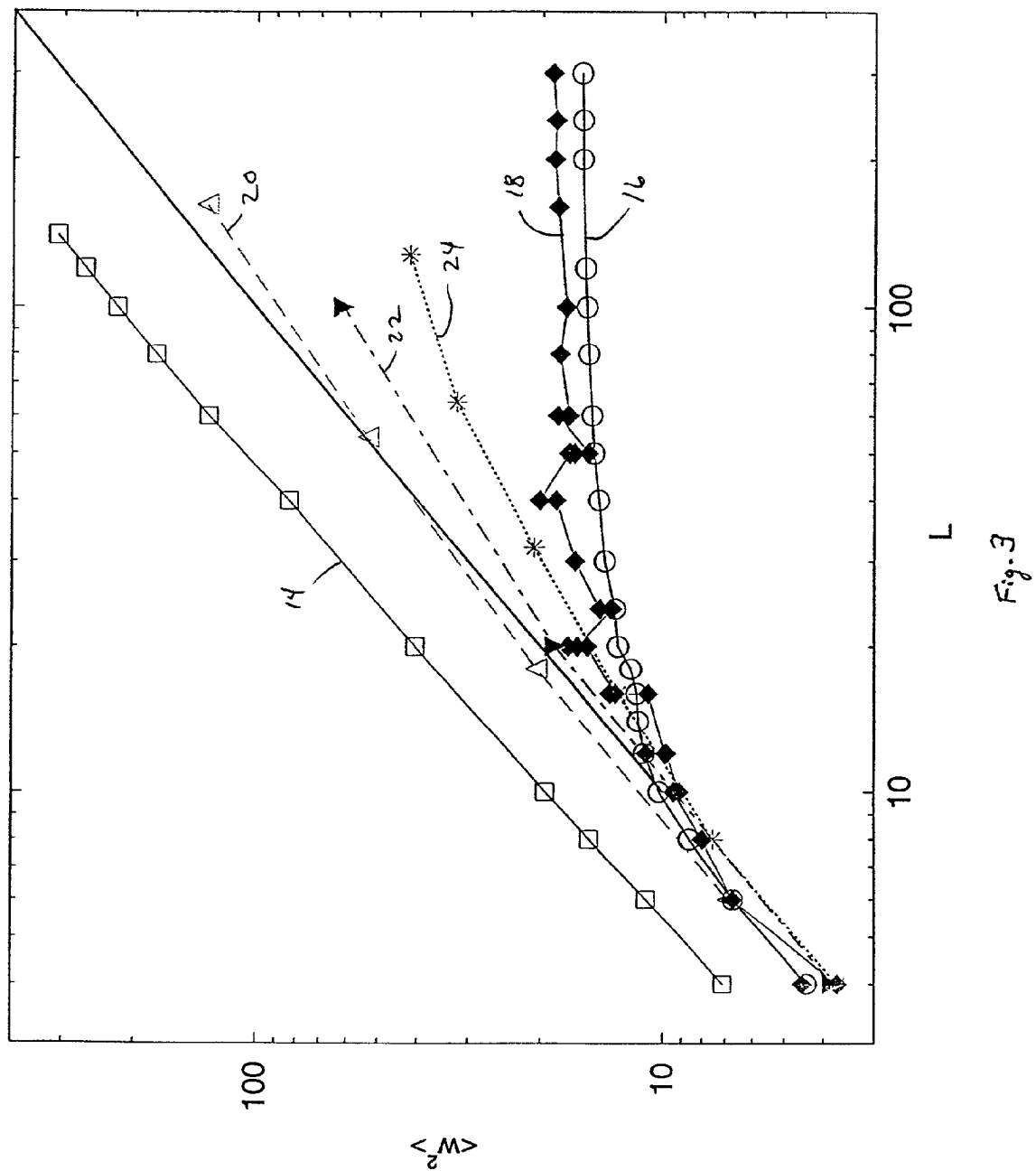
Figure 4:
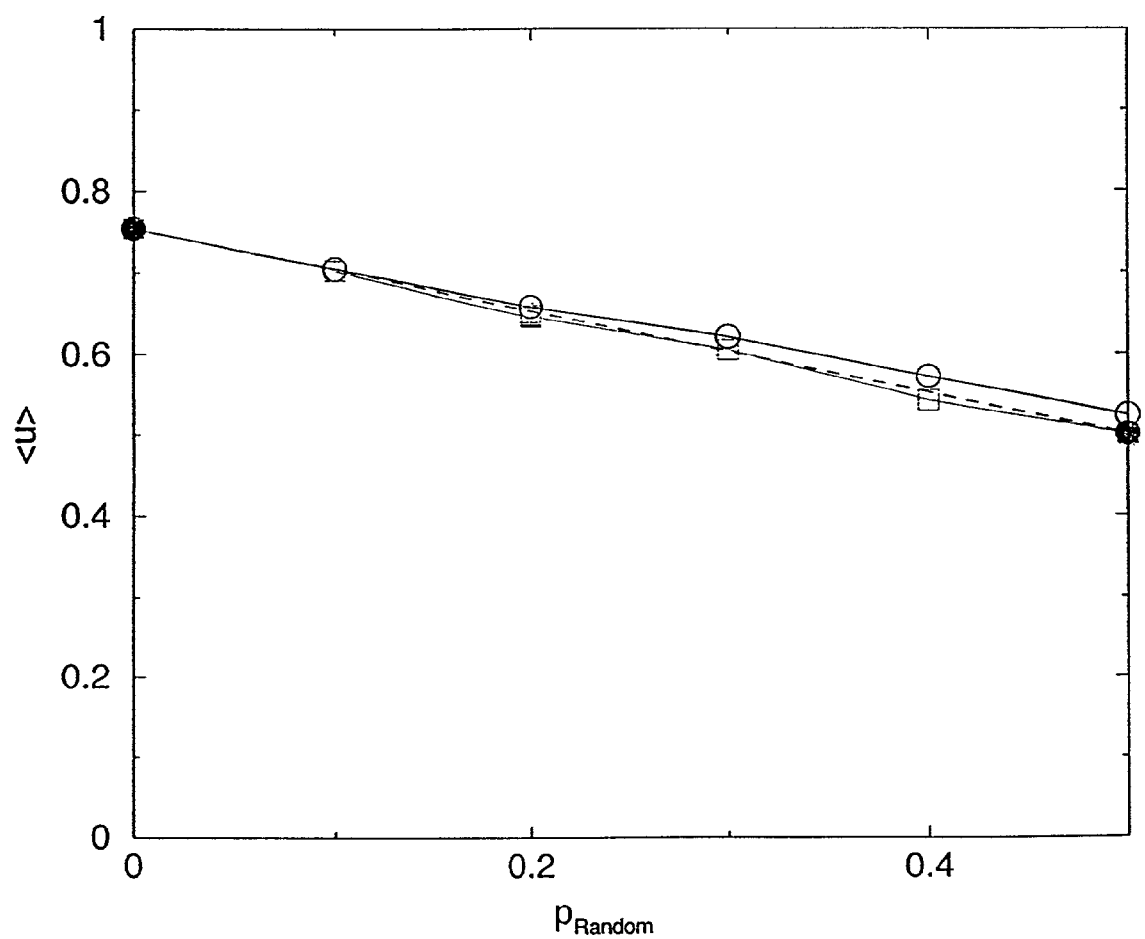
Figure 5:
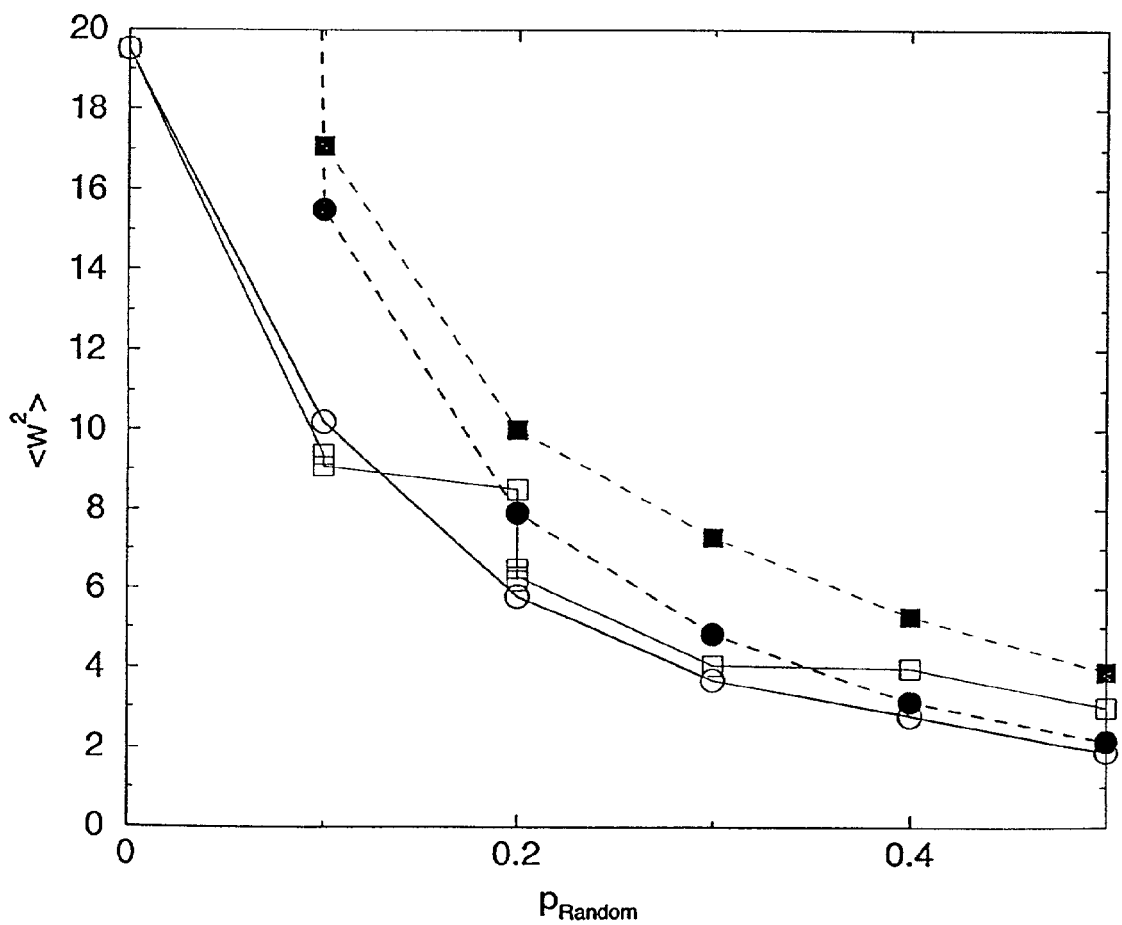
Figure 6:
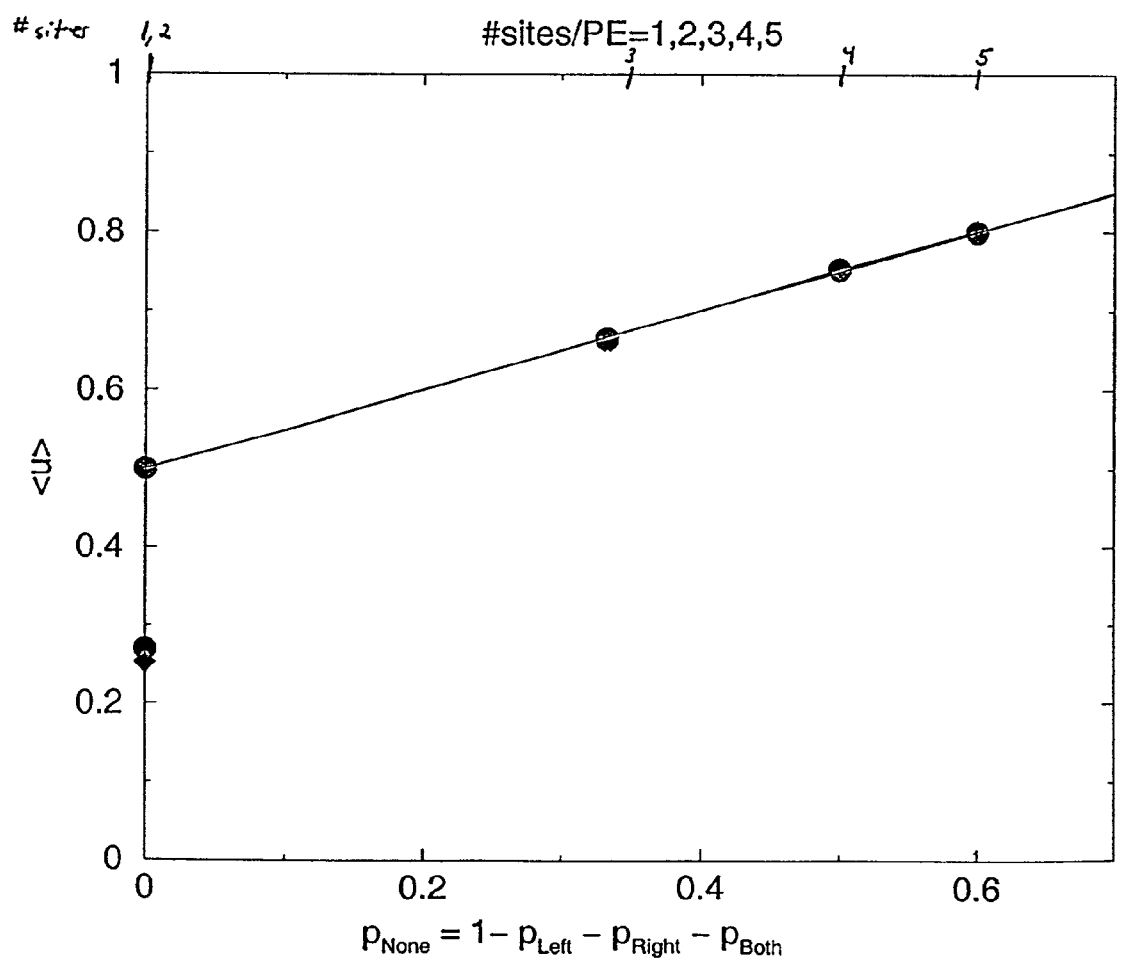
Figure 7:
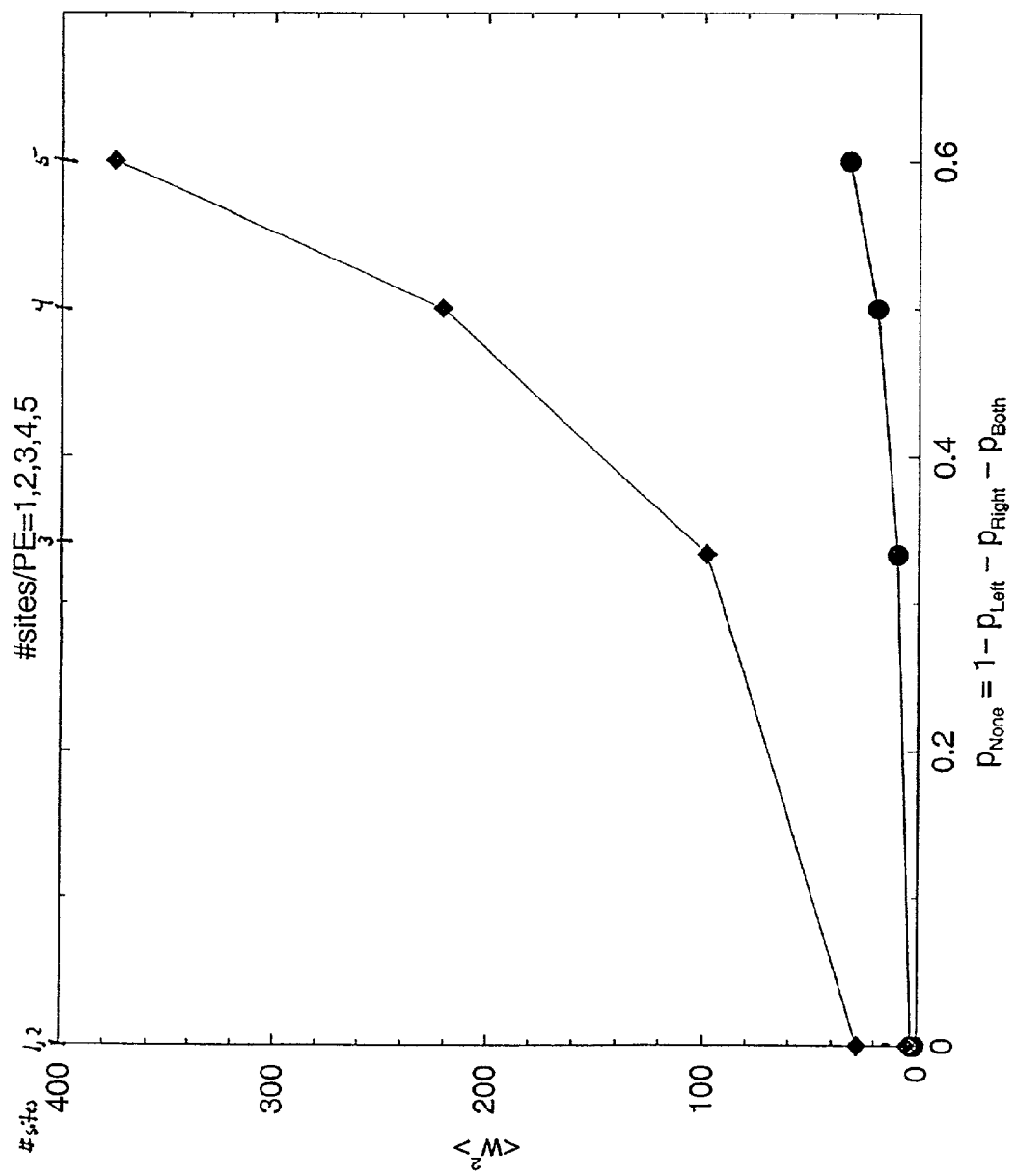

Having thus described the invention in general terms, reference will now be made to the accompanying drawings, which are not necessarily drawn to scale, and wherein:

FIG. 1A–1C are schematic diagrams illustrating one embodiment of the architecture of the present invention including exemplar connections between PEs;

FIG. 2 is a graph illustrating a linear-linear scale comparison of the stationary width, $<w^2>$, versus the number of PEs, L, according to one embodiment of the present invention;

FIG. 3 is a graph illustrating the comparison illustrated in FIG. 2 on a log-log scale;

FIG. 4 is a graph illustrating that the average density of local minima, $<u>_L$, of the PEs decreases with the probability that a PE checks the "virtual time" of a third connection, according to one embodiment of the present invention;

FIG. 5 is a graph illustrating that $<w^2>$ decreases as the probability of checking the third connection increases, according to one embodiment of the present invention;

FIG. 6 is a graph showing how $<u>_L$ grows as the number of lattice sites on each PE grows, with each PE not including the third connection, according to one embodiment of the present invention; and FIG. 7 is a graph showing how $<w^2>$ grows as the number of lattice sites on each PE grows, with each PE not including the third connection, according to one embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The following description will demonstrate how the architecture of the present invention can be utilized to perform fully scalable PDES. It should be understood, however, that the architecture can be utilized to perform any number of different simulations without departing from the spirit and scope of the present invention. As previously stated, when a PDES is executed sequentially, the PDES repeatedly processes the occurrence of events in simulated time, or "virtual time," by maintaining a time ordered event list holding time-stamped events scheduled to occur in the future, a clock indicating the current time and state variables defining the current state of the system. In this regard, the difficulty of PDES is that update attempts are not synchronized by a global clock. In fact, the traditional dynamic MC algorithms were long believed to be inherently serial, i.e., in spin language, the corresponding algorithm was thought to be able to update only one spin at a time. But an approach for parallel simulation of these has been presented that does not change the underlying Poisson process. Applications include modeling of cellular communication networks, particle deposition, and metastability and hysteresis in kinetic Ising models. In a distributed massively parallel scheme each PE carries a subsystem of the full system. The parallel algorithm must concurrently advance the Poisson streams corresponding to each subsystem without violating causality. This requires the concept of virtual time, as well as a synchronization scheme. Intuitively it is clear that systems with short-range interactions contain a substantial amount of parallelism. For the "conservative" approach of DES, the efficiency of the algorithm is simply the fraction of PEs that are guaranteed to attempt the update without breaking causality. The rest of the PEs must idle.

Consider a computer architecture with PEs in an d-dimensional hypercubic regular lattice topology where the underlying PEs have only nearest-neighbor interactions (e.g., Glauber spin-flip dynamics) and periodic boundary conditions. Also, consider the scalability for a "worst-case" scenario in which each PE hosts a single site (e.g., one spin) of the underlying system. While this may be the only scenario for a special-purpose computer with extremely limited local memory, one PE can generally host a block of sites on architectures with relatively large memory to thereby substantially increase the efficiency of the underlying system, bringing it to the level of practical applicability.

In a conventional parallel scheme, each PE generates its own virtual time for the next update attempt. The set of local times $\{\tau_i(t)\}_{i=1}^{L^d}$ constitute the virtual time horizon. Here, L is the linear size of the lattice ($L^d$ is the number of PEs), and t is the index of the simultaneously performed parallel steps.

Initially, $\tau_i(0)=0$ for every site. At each parallel time step, only those PEs for which the local simulated time is not greater than the virtual times of their nearest neighbor can attempt the update and increment their virtual time by an exponentially distributed random amount, $\eta_i(t)$. Without loss of generality we take $<\eta_i(t)>=1$. The other PEs idle. Due to the continuous nature of the random virtual times, for $t>0$ the probability of equal-time updates for any two sites is of measure zero. The comparison of the nearest-neighbor virtual times and idling, if necessary, enforces causality. Since at worst the PE with the absolute minimum simulated time makes progress, the algorithm is free from deadlock. For such a basic conservative scheme, the theoretical efficiency (ignoring communication overheads) is simply the fraction of non-idling PEs. This corresponds to the density of local minima of the virtual time horizon. At this point it should be noted that the evolution of the virtual time horizon is completely independent of the underlying model (except for its topology) and can be written as:

$$\tau_i(t+1) = \tau_i(t) + \prod_{j \in D_i^{nn}} \Theta(\tau_j(t) - \tau_i(t))\eta_i(t) \quad (1)$$

Here $D_i^{nn}$ is the set of nearest neighbors (nn) i, and $\Theta(\cdot)$ is the Heaviside step function. The evolution of the simulated time horizon is clearly analogous to an irreversibly growing and fluctuating surface.

At this point, to examine the scalability of the PDES, two quantities need to be studied. The first quantity is the density of local minima, $<u(t)>_L$, and, in particular, its asymptotic (or steady-state) value and finite-size effects. The density of local minima is important because the density of local minima corresponds directly to the efficiency of the algorithm. The second quantity is the surface width, $$<w^2(\underline{t})>=(1/L^d)<\Sigma_{i=1}^{L^d}[\tau_i(t)-\bar{\tau}(t)]^2>, \quad \text{where}$$
$$\bar{\tau}(t)=(1/L^d)\Sigma_{i=1}^{L^d}\tau_1(t).$$

The surface width describes the macroscopic roughness of the time horizon and has important consequences for actual implementations (e.g., optimal buffer size for a collecting statistics network).

Now consider the case of a one-dimensional computer architecture topology, i.e., d=1, with only nearest-neighbor interactions (e.g., Glauber spin-dynamics) and periodic boundary conditions. For d=1, it can be shown that by coarse-graining and direct simulation of equation (1), the evolution of the simulated time horizon belongs to the KPZ (Kardar, Parisi and Zhang) universality class for non-equilibrium surface growth. In this regard, $<w^2>$ saturates at a stationary value for every finite value of PEs. At the same time the density of local minima, $<u(t)>_L$, decreases monotonically with time towards a long-time asymptotic limit well separated from zero. The steady state is governed by the Edwards-Wilkinson Hamiltonian, and the stationary width scales as $<w^2>\sim L^{2\alpha}$, where $\alpha=\frac{1}{2}$ is the roughness exponent. In this regard, the coarse-grained landscape is a simple random-walk surface; the local slopes are short-range correlated, and the density of local minima is non-zero. Thus, for the computation phase of PDES, all one-dimension, i.e., d=1, PDES algorithms are scalable if the PDES algorithms have only short-ranged interactions and are implemented with a computer architecture having multiple PEs connected in a one-dimensional pattern. It is important to note that this characteristic is independent of the underlying size of the system being simulated.

In higher-dimensional computer architecture topologies, the same qualitative behavior observed is the same as that observed for the one-dimensional topology. In this regard, the surface roughens and saturates for any finite system. Simultaneously, the density of local minima decreases monotonically towards its asymptotic ($t\to\infty$) finite-size value. Again, the steady-state density of local minima appears to be well separated from zero. As such, the computation phase of PDES is also scalable for PDES in higher-dimensional computer architecture topologies, provided only short-ranged interactions are present between PEs, and the connectivities of the PEs are at least the dimension of the system being simulated.

As stated, short-ranged interactions allow the computation phase of the PDES to be scalable. But the short-ranged connections between the PEs also, undesirably, make the measurement phase of the PDES not scalable. As stated before, the stationary width, $<w^2>$, grows with the number of PEs, i.e., $<w^2>\sim L^{2\alpha}$. As long as $<w^2>$ grows with the problem's size, the complete PDES is not scalable. If every PE is connected to every other PE and checks the "virtual time" of a randomly chosen PE at regular intervals, however, then $<w^2>$ does not grow with the problem size. Such a connection pattern can generally be referred to as an "annealed random" pattern.

While an annealed random pattern of PE connections makes both the computational and measurement phases of PDES scalable, the annealed random pattern makes the connectivity pattern grow as the number of PEs grow, thus making the connectivity of the computer architecture not scalable. Further, connecting each PE to all other PEs requires an unnecessarily large amount of connections within the system. As such, the present invention provides a scalable system and method of interconnecting PEs in a multi-processor computer that makes both the computational and measurement phases of simulations, including PDES, scalable, while also making the connectivity of PEs small and scalable (i.e., keeping the number of interconnects between PEs independent of the number of PEs).

Referring to FIGS. 1A–1C, one-dimensional PDES can be implemented in a scalable computer architecture 10 by interconnecting each PE 12 to two or more PEs, with at least one PE further interconnected to at least one additional PE located remote from the respective at least one PE. The computer architecture can include any number of PEs but, in a preferred embodiment, the computer architecture includes a large number of PEs, numbering from the thousands to tens of thousands or more. As shown, to make the measurement phase of the PDES scalable, the architecture includes interconnects at a plurality of length scales, and preferably each length scale, between the PEs. For example, some interconnects will be short in length and interconnect neighboring PEs, while other interconnects will be long in length and interconnect PEs remote from each other at opposing sides of the architecture. The interconnects can be obtained in a variety of different manners, such as by using a "fractal-type" topology or a "quenched random" topology between PEs. In this regard, a fractal-type topology includes PEs interconnected irregularly at all scales of measurement between a greatest and smallest scale such that each PE is connected to three or more other PEs. The quenched random topology includes PEs that are randomly connected to three or more PEs and thereafter fixed in place. Because the annealed topology has each PE connected to each other PE, the annealed topology can be viewed as a lower bound for the width of the virtual time horizon of the PDES. In this regard, because the quenched random topology has virtual time horizon widths that closely follow those of the annealed topology, in a preferred embodiment the PEs are connected according to the quenched random topology.

As illustrated with respect to three connections between PEs, consider the PEs connected on a line, with each PE 12 connected to each nearest-neighbor PE. Additionally, each PE is connected to at least one additional, remote PE (one as illustrated). It should be understood that although the PEs on each end of the line illustrated have no outermost neighbor, the outermost PEs would typically be connected to each other as their respective outermost neighbor connection. As shown, FIG. 1A illustrates an architecture where the number of PEs increase by $2 \times 3^n = 2, 6, 18, \ldots$ Similarly, FIG. 1B shows another exemplar architecture having PEs that increase by $4 \times 5^n = 4, 20, 100, \ldots$ And FIG. 1C shows an architecture having $2^n = 2, 4, 8, 16, 32, \ldots$ PEs.

Attention is now drawn to FIG. 2, which illustrates a linear-linear scale graph of the stationary width, $<w^2>$, versus the number of PEs, L, in one exemplar embodiment. In this embodiment, each PE in the architecture includes four lattice sites. If the lattice site is at the end of the four-site sequence, the PE checks the virtual time of the PE for which the respective lattice site is the neighbor. But if the lattice site is in the middle of the four-site sequence, then 10% of the time the PE checks the virtual time of the PE given by the third connection. As shown, as an upper bound, $<w^2>$ grows faster than the number of PEs when no additional connections are present between the PEs (line 14). As the lower bound, annealed connections show, the $<w^2>$ essentially remains constant as the number of PEs grow (line 16). Also, between the upper and lower bounds, the graph illustrates fractal topologies having $2 \times 3^n$ PEs (line 20), $4 \times 5^n$ PEs (line 22) and $2^n$ PEs (line 24). As shown, the fractal topologies have a $<w^2>$ that grows slower than a power law and, for a large enough number of PEs, L, the $<w^2>$ may become independent of L, thereby making the PDES algorithm scalable. As such, the number of PEs is preferably large, numbering from the thousands to tens of thousands. It is possible for any one of the fractal topologies that $<w^2>$ grows logarithmically with L. In this regard, FIG. 3 illustrates the same results as FIG. 2 on a log-log scale.

FIG. 4 illustrates that the average density of local minima, $<u>_L$, of the PEs, which corresponds directly to the efficiency of the algorithm, decreases with the probability that a PE checks the "virtual time" of the third connection. In this regard, the probability for the topologies illustrated in FIGS. 2 and 3 is 10%. Note that FIG. 4 shows that the calculation portion of the PDES remains scalable for any probability since $<u>_L$ remains finite as the number of PEs grows. FIG. 5 shows that $<w^2>$ decreases as the probability of checking the third connection increases.

Referring now to FIGS. 6 and 7, it is informative to show how $<U>_L$ grows (FIG. 6) and $<w^2>$ grows (FIG. 7) as the number of lattice sites on each PE grows, with each PE not including the third connection. As shown, as the number of computations completed by a PE without the need to check neighboring PEs grows, the efficiency increases, but the scalability of the measurement phase decreases.

The present invention therefore provides a scalable computer architecture. While the conventional annealed random pattern of PE connections makes both the computational and measurement phases of simulations scalable, the annealed random pattern makes the connectivity pattern grow as the number of PEs grow, thus making the connectivity of the computer architecture not scalable. As such, the present invention provides an architecture including a small number of interconnections between PEs that are independent of the number of PEs. In this regard, the present invention provides a scalable computer architecture and method of interconnecting PEs in a multi-processor computer that makes both the computational and measurement phases of simulations scalable, while also making the connectivity of PEs scalable, and requiring few connections to each PE.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A scalable computer architecture capable of performing fully scalable simulations, said architecture comprising:
   a plurality of processing elements; and
   a plurality of interconnections between the plurality of processing elements capable of interconnecting the plurality of processing elements, wherein at least two interconnections interconnect each processing element to at least two other processing elements, wherein at least one interconnection further interconnects at least one processing element to at least one other processing element located remote from the respective at least one processing element,
   wherein the computer architecture supports variations in the number of processing elements, and wherein the number of interconnections between processing elements is independent of the number of processing elements so that the number of processing elements is capable of changing without similarly changing the number of interconnections between processing elements, thereby permitting connectivity between the processing elements to be scalable.

2. A scalable computer architecture according to claim 1, wherein the plurality of interconnections interconnect the plurality of processing elements according to a fractal-type method.

3. A scalable computer architecture according to claim 1, wherein the plurality of interconnections interconnect the plurality of processing elements according to a quenched random method.

4. A scalable computer architecture according to claim 1, wherein the plurality of interconnections include at least one interconnection at each length scale of the plurality of processing elements.

5. A scalable computer architecture according to claim 1, wherein the plurality of processing elements are organized in a one-dimensional topology.

6. A scalable computer architecture according to claim 1, wherein the plurality of interconnections connect each processing element to each neighboring processing element located adjacent the respective processing element, and wherein at least one interconnection further connects at least one processing element to at least one other processing element located remote from the respective at least one processing element.

7. A scalable computer architecture according to claim 1, wherein the plurality of processing elements are organized in a multi-dimensional topology, wherein the dimension of the multi-dimensional topology is greater than one.

8. A scalable system to facilitate fully scalable simulations comprising a plurality of processing elements, wherein each processing element capable of being interconnected to at least two other processing elements, wherein at least one processing element is further capable of being interconnected to at least one other processing element located remote from the respective at least one processing element, wherein the scalable system supports variations in the number of processing elements, and wherein the number of other processing elements interconnected to each processing element is independent of the number of processing elements so that the number of processing elements is capable of changing without similarly changing the number of other processing elements interconnected to each processing element, thereby permitting connectivity between the processing elements to be scalable.

9. A scalable system according to claim 8, wherein the plurality of processing elements are interconnected according to a fractal-type method.

10. A scalable system according to claim 8, wherein the plurality of processing elements are interconnected according to a quenched random method.

11. A scalable system according to claim 8, wherein the plurality of processing elements are interconnected such that at least one pair of processing elements are interconnected at each length scale of the plurality of processing elements.

12. A scalable system according to claim 8, wherein the plurality of processing elements are organized in a one-dimensional topology.

13. A scalable system according to claim 8, wherein the plurality of processing elements are organized in a multi-dimensional topology, wherein the dimension of the multi-dimensional topology is greater than one.

14. A scalable system according to claim 8, wherein the each processing element is interconnected to each neighboring processing element located adjacent the respective processing element, and wherein at least one processing element is interconnected to at least one other processing element located remote from the respective at least one processing element.

15. A method of fabricating a scalable computer architecture capable of performing fully scalable parallel discrete event simulations, said method comprising:
  organizing a first number of processing elements; and
  interconnecting the first number of processing elements so that each processing element is interconnected to at least two other processing elements, and so that at least one processing element is further interconnected to at least one other processing element located remote from the respective at least one processing element,
  wherein the number of other processing elements interconnected to each processing element is independent of the number of processing elements so that the number of processing elements is capable of changing without similarly changing the number of other processing elements interconnected to each processing element, thereby permitting connectivity between the processing elements to be scalable.

16. A method according to claim 15, wherein interconnecting the plurality of processing elements comprises interconnecting the plurality of processing elements according to a fractal-type method.

17. A method according to claim 15, wherein interconnecting the plurality of processing elements comprises interconnecting the plurality of processing elements according to a quenched random method.

18. A method according to claim 15, wherein interconnecting the plurality of processing elements comprises interconnecting the plurality of processing elements such that at least one pair of processing elements are interconnected at each length scale of the plurality of processing elements.

19. A method according to claim 15, wherein organizing the plurality of processing elements comprises organizing the plurality of processing elements in a one-dimensional topology.

20. A method according to claim 15, wherein organizing the plurality of processing elements comprises organizing the plurality of processing elements in a multi-dimensional topology, wherein the dimension of the multi-dimensional topology is greater than one.

21. A method according to claim 15, wherein interconnecting the plurality of processing elements comprises interconnecting the each processing element to each neighboring processing element located adjacent the respective processing element, wherein at least one processing element is interconnected at least one other processing element located remote from the respective at least one processing element.

22. A method according to claim 15 further comprising:
  changing the number of processing elements to a second number; and interconnecting the second number of processing elements so that each processing element is interconnected to at least two other processing elements, and so that at least one processing element is further interconnected to at least one other processing element located remote from the respective at least one processing element,
  wherein the number of other processing elements interconnected to each processing element is independent of the number of processing elements so that the number of processing elements is capable of changing from the first number to the second number without similarly changing the number of other processing elements interconnected to each processing element, thereby permitting connectivity between the processing elements to be scalable.

* * * * *